United States Patent [19]

Merkel et al.

[11] Patent Number: 5,689,198
[45] Date of Patent: Nov. 18, 1997

[54] CIRCUITRY AND METHOD FOR GATING INFORMATION

[75] Inventors: Lawrence Joseph Merkel; John Stephen Muhich, both of Austin, Tex.

[73] Assignee: International Business Machines Corporation, Armonk, N.Y.

[21] Appl. No.: 574,085

[22] Filed: Dec. 18, 1995

[51] Int. Cl.[6] .................................................. H03K 9/003
[52] U.S. Cl. ............................ 326/121; 326/31; 326/87
[58] Field of Search ........................... 326/21, 31, 33, 326/86–87, 121

[56] References Cited

U.S. PATENT DOCUMENTS

| | | |
|---|---|---|
| 4,704,548 | 11/1987 | Strong et al. . |
| 4,940,908 | 7/1990 | Tran . |
| 5,233,233 | 8/1993 | Inoue et al. . |
| 5,250,855 | 10/1993 | Asato .................................. 326/86 X |
| 5,338,980 | 8/1994 | Ovens . |
| 5,550,487 | 8/1996 | Lyon .................................. 326/21 X |

OTHER PUBLICATIONS

IBM Technical Disclosure Bulletin, vol. 19, No. 1, Jun. 1976.
IBM Technical Disclosure Bulletin, vol. 36, No. 09A, Sep. 1993, pp 87–88.

*Primary Examiner*—David R. Hudspeth
*Attorney, Agent, or Firm*—Michael A. Davis, Jr.

[57] ABSTRACT

A first inverter includes a first input coupled to a first input node. Also, the first inverter includes a first output coupled to an output node. Further, the first inverter includes a voltage node. A second inverter includes a second input coupled to a second input node. Moreover, the second inverter includes a second output coupled to the voltage node.

5 Claims, 3 Drawing Sheets

CIRCUITRY AND METHOD FOR GATING INFORMATION

TECHNICAL FIELD

This patent application relates in general to electronic circuitry and in particular to a method and circuitry for gating information.

BACKGROUND

An electronic circuit logic gate outputs a signal in response to one or more input signals. For example, NAND logic gate circuitry outputs a signal (having a binary logic state) in response to two input signals (each having a respective binary logic state) according to the following truth table:

| Output Signal | Input Signals | |
|---|---|---|
| D/ | A | B |
| 1 | 0 | 0 |
| 1 | 0 | 1 |
| 1 | 1 | 0 |
| 0 | 1 | 1 |

According to this truth table, D=A * B, where * represents a logical AND function, and where D/ is the logical inverse of D.

FIG. 1 is a schematic electrical circuit diagram of static NAND logic gate circuitry, indicated generally at 10, according to the prior art. In FIG. 1, transistors T1 and T3 are p channel field effect transistors ("FETs"), and transistors T2 and T4 are n channel FETs. In FIG. 1, OUT=D/ with respect to the truth table shown above.

The binary logic state of OUT changes (or "transitions"), if at all, in response to (and within a period of time after) changing (or "transitioning") a binary logic state of input node A and/or input node B, consistent with the truth table shown above. Circuitry 10 is substantially balanced, so the period of time for OUT's binary logic state to transition (if at all) is substantially independent of whether such transition occurs in response to transitioning of A's or B's binary logic state. Accordingly, each of transistors T1, T2, T3 and T4 has a substantially identical channel width to length ratio (e.g. 10:1).

Nevertheless, it is possible for the respective binary logic states of A and B to transition at significantly different moments relative to the beginning of a clock cycle. Therefore, in certain situations, it is advantageous for the binary logic state of OUT to transition (if at all) within a first period of time ("Time1") after transitioning of A's binary logic state, and within a second period of time ("Time2") after transitioning of B's binary logic state. This is advantageous in situations where:

Time1 is significantly shorter than Time2; and
transitioning (if at all) of A's logic state occurs significantly later within the clock cycle than transitioning (if at all) of B's logic state.

A conventional approach for making Time1 significantly shorter than Time2 is modifying circuitry 10 so that one or more of the transistors' channel width to length ratios is tapered. For example, if each of transistors T1, T2, T3 and T4 originally has a channel width to length ratio of 10:1, transistors T2 and T4 can be tapered so that transistor T2 has a channel width to length ratio of 8:1 while transistor T4 has a channel width to length ratio of 12:1. Moreover, transistors T1 and T3 and can be tapered so that transistor T1 has a channel width to length ratio of 12:1 while transistor T3 has a channel width to length ratio of 8:1.

Such a "tapered" modification of circuitry 10 is substantially unbalanced, so the period of time for OUT's binary logic state to transition (if at all) is dependent upon whether such transition occurs in response to transitioning of A's or B's binary logic state. Under such a tapering technique, although Time1 can be significantly shorter than Time2, a negative consequence is that Time2 is unacceptably long in some situations. This negative consequence is particularly true when OUT's binary logic state transitions from a logic 0 (low voltage) state to a logic 1 (high voltage) state in response to transitioning of B's binary logic state.

Thus, a need has arisen for a method and circuitry for gating information, in which a state of an output transitions (if at all) within a first period of time after transitioning of a first input's state, and within a second period of time after transitioning of a second input's state, without the second period of time being unacceptably long.

SUMMARY

A first inverter includes a first input coupled to a first input node. Also, the first inverter includes a first output coupled to an output node. Further, the first inverter includes a voltage node. A second inverter includes a second input coupled to a second input node. Moreover, the second inverter includes a second output coupled to the voltage node.

It is a technical advantage that a state of an output transitions (if at all) within a first period of time after transitioning of a first input's state, and within a second period of time after transitioning of a second input's state, without the second period of time being unacceptably long.

BRIEF DESCRIPTION OF THE DRAWINGS

An illustrative embodiment of the present inventions and their advantages are better understood by referring to the following descriptions and accompanying drawings, in which.

DETAILED DESCRIPTION

An illustrative embodiment of the present inventions and their advantages are better understood by referring to FIGS. 1–6 of the drawings, like alphanumeric characters being used for like and corresponding parts of the accompanying drawings.

Figure 1:
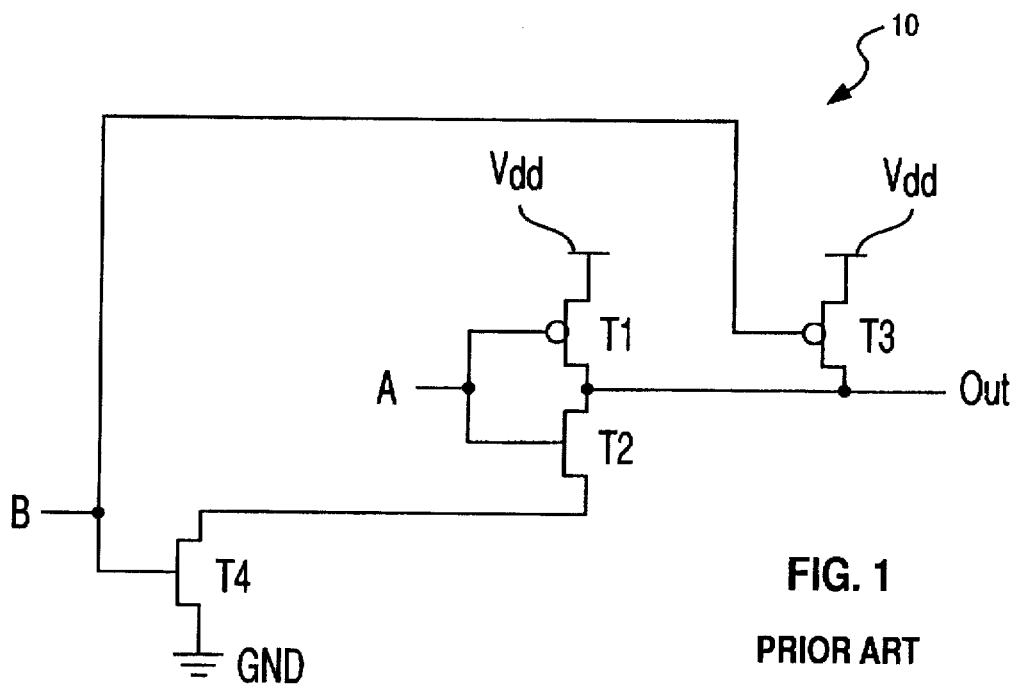
FIG. 1 is a schematic electrical circuit diagram of static NAND logic gate circuitry according to the prior art.
Figure 2:
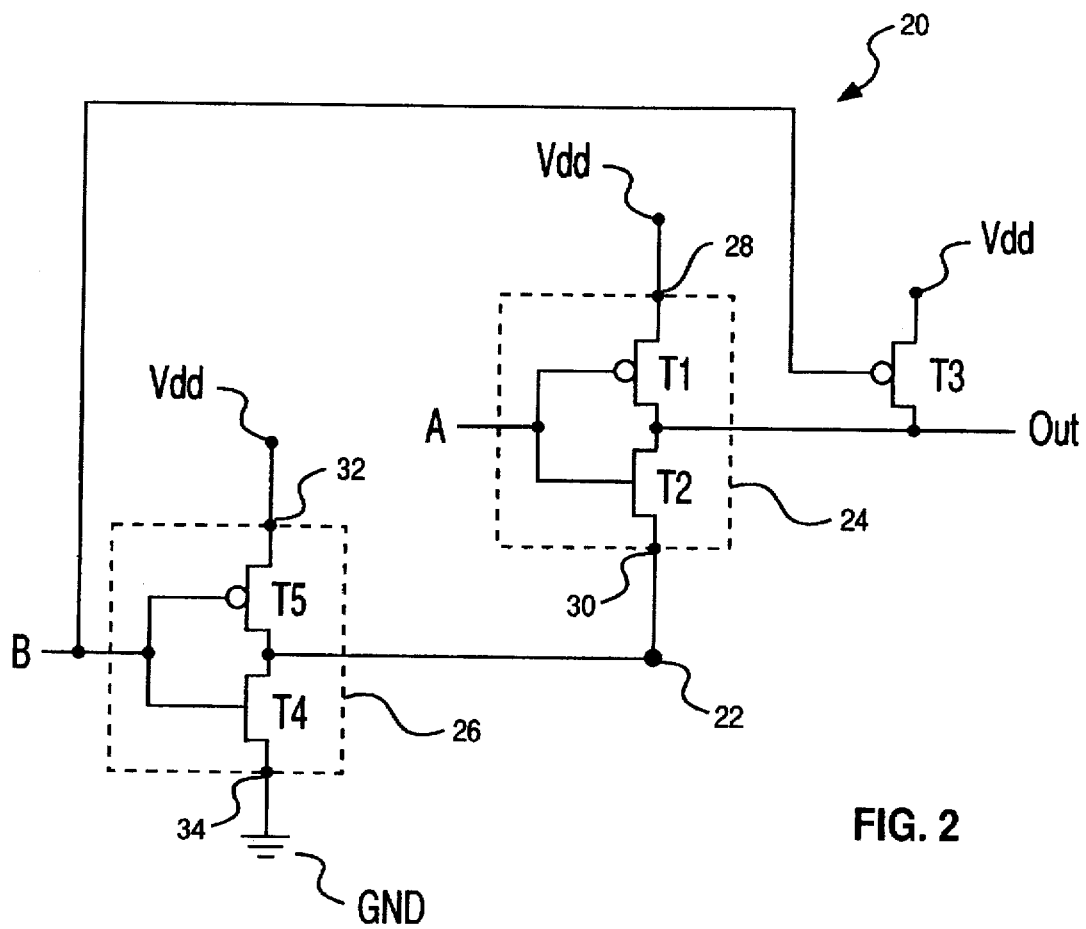
FIG. 2 is a schematic electrical circuit diagram of static NAND logic gate circuitry according to the illustrative embodiment.

FIG. 2 is a schematic electrical circuit diagram of static NAND logic gate circuitry, indicated generally at 20, according to the illustrative embodiment. In FIG. 2, transistors T1 and T3 are p channel field effect transistors, and transistors T2 and T4 are n channel field effect transistors. Moreover, transistor T5 is a p channel field effect transistor ("FET").

Circuitry 20 has two input nodes, A and B, each for inputting binary signal information, so that circuitry 20 is a two-input NAND logic gate.

Input node A is connected to an input of a complementary metal oxide semiconductor ("CMOS") inverter, indicated by dashed enclosure 24. An output of inverter 24 is connected to an output node OUT. A voltage supply node 28 of inverter 24 is connected to a voltage supply node Vdd.

Input node B is connected to an input of a CMOS inverter, indicated by dashed enclosure 26. An output of inverter 26 is connected to a voltage reference node 30 of inverter 24. A voltage supply node 32 of inverter 26 is connected to Vdd. A voltage reference node 34 of inverter 26 is connected to a voltage reference node GND.

Further, input node B is connected to a gate of transistor T3. A source of transistor T3 is connected to Vdd. A drain of transistor T3 is connected to OUT.

Inverter 24 includes transistors T1 and T2. The input (connected to A) of inverter 24 is connected to gates of transistors T1 and T2. A source of transistor T1 is connected to node 28, and a source of transistor T2 is connected to node 30. The drains of transistors T1 and T2 are connected to the output (connected to OUT) of inverter 24.

Inverter 26 includes transistors T4 and T5. The input (connected to B) of inverter 26 is connected to gates of transistors T4 and T5. A source of transistor T5 is connected to node 32, and a source of transistor T4 is connected to node 34. The drains of transistors T4 and T5 are connected to the output (connected to node 30) of inverter 26.

In the illustrative embodiment, Vdd has a voltage of approximately 3.3 volts relative to GND. Moreover, Vdd has a high voltage logic one (1) "true" state, and GND has a low voltage logic zero (0) "false" state.

In operation, if each of A and B has a logic 1 state, then transistors T2 and T4 are substantially turned on while transistors T1, T3 and T5 are substantially turned off. In this manner, transistors T2 and T4 drive output node OUT toward the logic 0 state of GND.

By comparison, if A has a logic 0 state while B has a logic 1 state, then transistor T1 is substantially turned on while transistor T2 is substantially turned off. In this manner, transistor T1 drives output node OUT toward the logic 1 state of Vdd.

Also, if A has a logic 1 state while B has a logic 0 state, then transistors T3 and T5 are substantially turned on while transistors T1 and T4 are substantially turned off. In this manner, transistors T3 and T5 drive output node OUT toward the logic 1 state of Vdd; transistor T5 performs this function while transistor T2 conducts current.

Finally, if A has a logic 0 state while B has a logic 0 state, then transistors T1 and T3 are substantially turned on while transistors T2 and T4 are substantially turned off. In this manner, transistors T1 and T3 drive output node OUT toward the logic 1 state of Vdd.

In the illustrative embodiment, it is possible for the respective binary logic states of A and B to transition at significantly different moments relative to the beginning of a clock cycle. In order to help accommodate such a situation, the binary logic state of OUT transitions (if at all) within a first period of time ("Time1") after transitioning of A's binary logic state, and within a second period of time ("Time2") after transitioning of B's binary logic state. This is advantageous in situations where:

Time1 is significantly shorter than Time2; and transitioning (if at all) of A's logic state occurs significantly later within the clock cycle than transitioning (if at all) of B's logic state.

Accordingly, the period of time for OUT's binary logic state to transition (if at all) is dependent upon whether such transition occurs in response to transitioning of A's or B's binary logic state. Relative to conventional balanced static NAND logic gate circuitry, Time1 is shorter for circuitry 20 of FIG. 2. Accordingly, the binary logic state of OUT transitions (if at all) within a shorter period of time ("Time1") after transitioning of A's binary logic state.

In a significant aspect of the illustrative embodiment, transistors T1, T2, T3, T4 and T5 are suitably sized to achieve the operation of circuitry 20 discussed hereinabove and further discussed hereinbelow. For example, in a significant aspect of the illustrative embodiment, transistor T5 is suitably sized, so that transistor T5 operates to help keep Time2 from being unacceptably long. This operation of transistor T5 is particularly advantageous when OUT's binary logic state transitions from a logic 0 (low voltage) state to a logic 1 (high voltage) state in response to transitioning of B's binary logic state.

More particularly, in the illustrative embodiment, transistors T1, T2, T3, T4 and T5 are sized to have the following channel width to length ratios:

| Transistor | Ratio |
| --- | --- |
| T1 | 10:1 |
| T2 | 7:1 |
| T3 | 5:1 |
| T4 | 15:1 |
| T5 | 15:1 |

Accordingly, transistors T3 and T4 are tapered by a factor N=0.5 relative to transistor T1's medium channel width to length ratio of 10:1. The channel width to length ratio of transistor T5 is sized relative to transistor T4, so that transistors T4 and T5 operate together as a complementary metal oxide semiconductor ("CMOS") inverter.

Significantly, transistor T3 is advantageously smaller than in previous techniques, in part because transistor T5 operates together in parallel with transistors T3 and T2 to help properly drive a node 22 to a high voltage logic state if B transitions to a logic 0 state while A has a logic 1 state. In this manner, transistor T5 assists transistor T3 in such a situation to help drive OUT from a logic 0 state to a logic 1 state.

More particularly, transistor T5 drives current through transistor T2 to output node OUT while transistor T2 conducts current. This significantly raises the voltage at OUT toward the logic 1 state of Vdd before transistor T2 substantially stops conducting current. Transistor T3 ensures that the voltage at OUT eventually is substantially equal to the voltage at Vdd (a logic 1 state).

Transistor T5 also provides other advantages. For example, node 22 is connected to the source of transistor T2. Node 22 operates as a virtual ground if B has a logic 1 state prior to A transitioning from a logic 0 state to a logic 1 state. Node 22 operates as a virtual ground, in part because transistor T5 provides more capacitance to node 22, thereby helping maintain a low voltage at node 22. By node 22 operating as a virtual ground, the resistance of transistor T4 is less significant with respect to driving OUT to a low voltage logic 0 state.

Accordingly, transistor T2's effective drive strength in such a situation is more consistent with the normal drive strength of a transistor having a channel width to length ratio of 7:1, almost as if the source of transistor T2 were connected directly to GND. This enables the actual size of transistor T2 to be smaller than in previous techniques. Moreover, since transistor T2 is smaller, input load at the gate of transistor T2 is lower. Also, since transistors T2 and T3 are smaller in circuitry 20 of FIG. 2, diffusion capacitance at output node OUT is lower.

Figure 3:
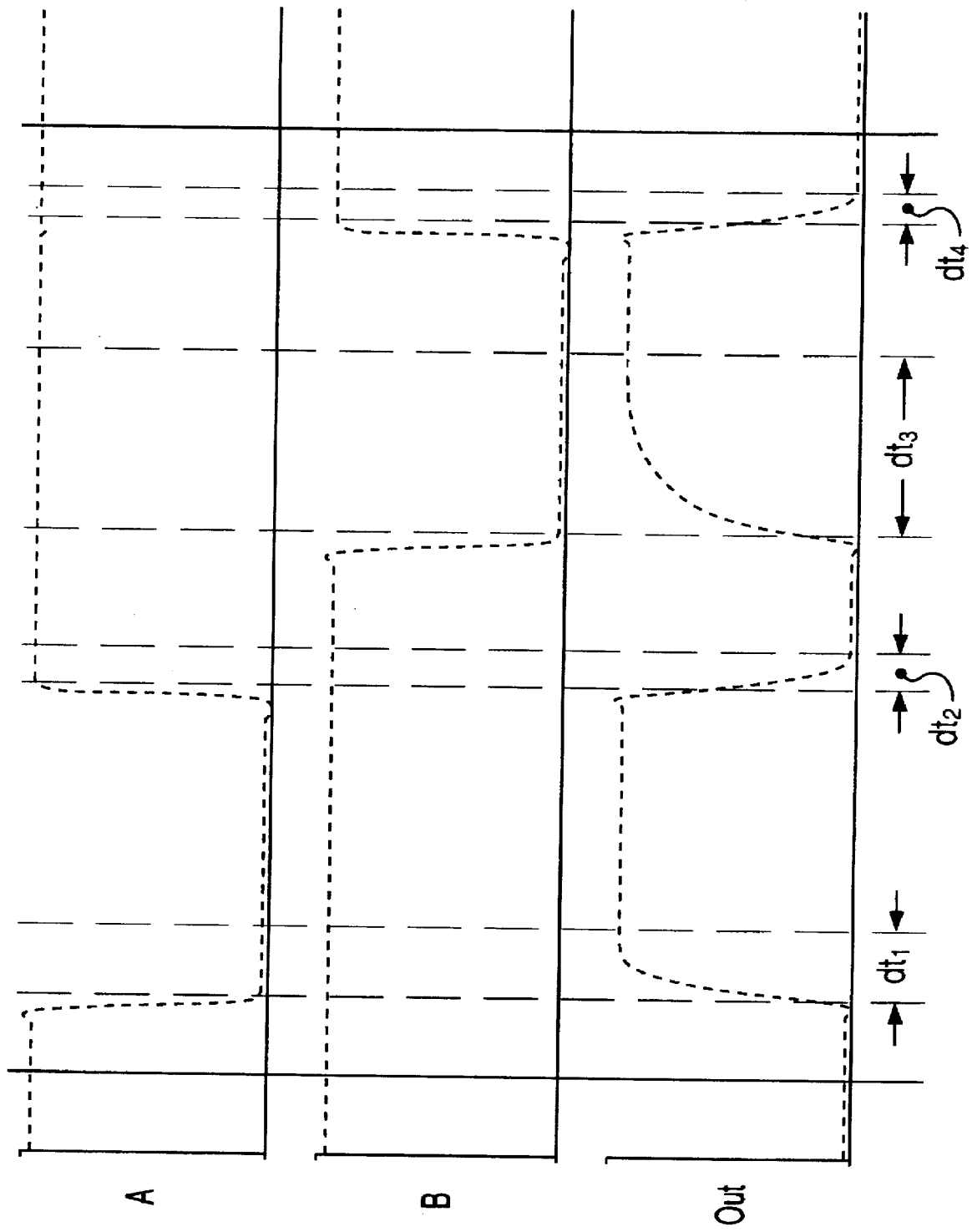
FIG. 3 is a timing diagram of a voltage at an output of the circuitry of FIG. 2 relative to voltages at inputs of the circuitry of FIG. 2.

FIG. 3 is a timing diagram, for a 0.2 picofarad ("pF") load, of a voltage at output node OUT of circuitry 20 relative to voltages at input nodes A and B of circuitry 20. As shown in FIG. 3, a first time delay ("dt1") occurs between (a) the moment when A has fully transitioned from a logic 1 state to a logic 0 state and (b) the moment when OUT has fully transitioned from a logic 0 state to a logic 1 state in response thereto. Similarly, a second time delay ("dt2") occurs between (a) the moment when A has fully transitioned from a logic 0 state to a logic 1 state and (b) the moment when OUT has fully transitioned from a logic 1 state to a logic 0 state in response thereto.

Likewise, a third time delay ("dt3") occurs between (a) the moment when B has fully transitioned from a logic 1 state to a logic 0 state and (b) the moment when OUT has fully transitioned from a logic 0 state to a logic 1 state in response thereto. Finally, a fourth time delay ("dt4") occurs between (a) the moment when B has fully transitioned from a logic 0 state to a logic 1 state and (b) the moment when OUT has fully transitioned from a logic 1 state to a logic 0 state in response thereto.

From FIG. 3, it is readily apparent that dt3 is significantly longer than any one of dt1, dt2 and dt4. Nevertheless, due in part to the operation of transistor T5, dt3 is not unacceptably long, particularly relative to previous techniques. For example, computer simulations have shown that dt3 is approximately 10% faster than a time delay of equally-sized conventional (lacking transistor T5) tapered static NAND logic gate circuitry manufactured under comparable semiconductor fabrications guidelines.

Moreover, computer simulations have shown that dt1 and dt2 of circuitry 20 are:

approximately 40% faster than time delays of equally-sized conventional (lacking transistor T5) balanced static NAND logic gate circuitry manufactured under comparable semiconductor fabrication guidelines; and no more than approximately 10% slower than time delays of a medium-sized CMOS inverter manufactured under comparable semiconductor fabrication guidelines.

Figure 4:
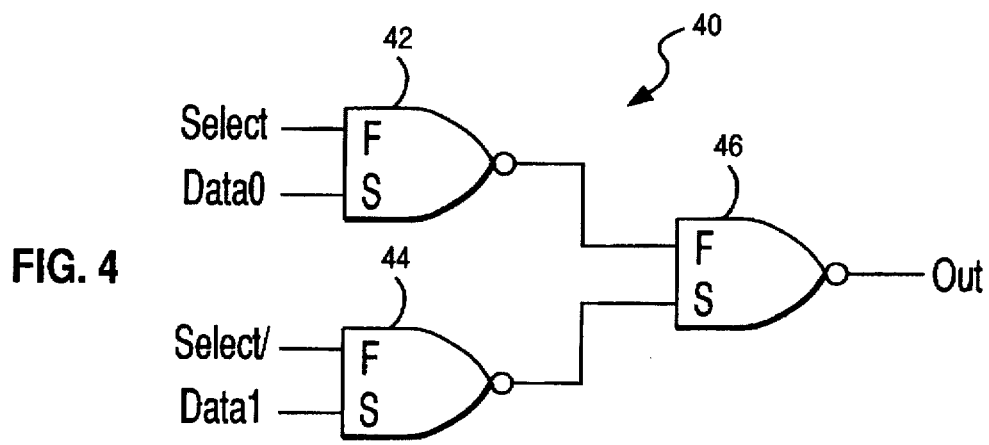
FIG. 4 is a schematic electrical circuit diagram of a multiplexer including the circuitry of FIG. 2.

FIG. 4 is a schematic electrical circuit diagram of a multiplexer, indicated generally at 40. Each of NAND logic gates 42, 44 and 46 is substantially identical in design and implementation to circuitry 20 of FIG. 2. An output of gate 42 is connected to a fast ("F") input of gate 46. Similarly, an output of gate 44 is connected to a slow ("S") input of gate 46.

The output of gate 46 is labelled in FIG. 4 as OUT. A select line SELECT is connected to an F input of gate 42, and SELECT/ is connected to an F input of gate 44, where SELECT/ is the logical inverse of SELECT. In the example of FIG. 4, SELECT is generated in response to SELECT/, rather than vice versa.

A data line DATA0 is connected to an S input of gate 42, and a data line DATA1 is connected to an S input of gate 44.

Each of the F inputs of gates 42, 44 and 46 is substantially identical in design and implementation to input node A of circuitry 20 (FIG. 2). Likewise, each of the S inputs of gates 42, 44 and 46 is substantially identical in design and implementation to input node B of circuitry 20.

In operation, if SELECT has a logic 1 state, then by definition SELECT/ has a logic 0 state. In that situation, the output of gate 44 has a logic 1 state. Accordingly, gates 42 and 46 operate as serially connected inverters, so that OUT=DATA0.

Likewise, if SELECT has a logic 0 state, then by definition SELECT/ has a logic 1 state. In that situation, the output of gate 42 has a logic 1 state. Accordingly, gates 44 and 46 operate as serially connected inverters, so that OUT=DATA1.

In the example of FIG. 4, transitioning (if at all) of SELECT/'s (and therefore also SELECT's) logic state occurs significantly later within a clock cycle than transitioning (if at all) of DATA1's (and e.g. also DATA0's) logic state. For that reason, SELECT is connected to the F input of gate 42, SELECT/ is connected to the F input of gate 44, DATA0 is connected to the S input of gate 42, and DATA1 is connected to the S input of gate 44. By comparison, if the DATA0 and DATA1 logic state transitions were to occur significantly later within a clock cycle than the SELECT and SELECT/ logic state transitions, then preferably DATA0 and DATA1 would be connected to the F inputs while SELECT and SELECT/ would be connected to the S inputs.

Similarly, since SELECT is generated in response to SELECT/ (rather than vice versa), transitioning (if at all) of SELECT's logic state occurs significantly later with a clock cycle than transitioning (if at all) of SELECT/'s logic state. For that reason, the output of gate 42 (which inputs SELECT) is connected to the F input of gate 46, and the output of gate 44 (which inputs SELECT/) is connected to the S input of gate 46.

As discussed further hereinabove in connection with FIG. 3 and circuitry 20 (FIG. 2), each of gates 44 and 46 is approximately 40% faster than equally-sized conventional (lacking transistor T5) balanced static NAND logic gate circuitry manufactured under comparable semiconductor fabrication guidelines. Accordingly, as more gates (such as gates 42 and 46) are connected in series, the time delay advantages provided by circuitry 20 are compounded.

Figure 5:
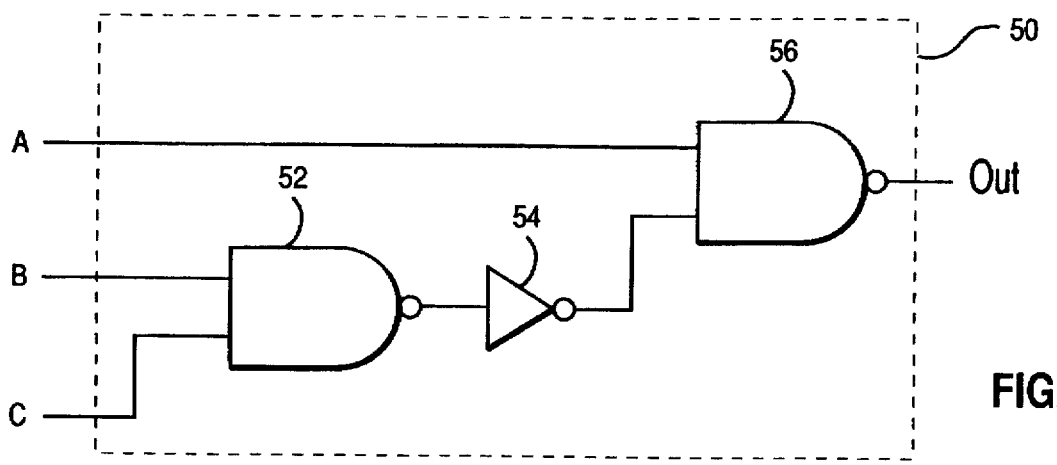
FIG. 5 is a schematic electrical circuit diagram of static NAND logic gate circuitry according to a first alternative embodiment.

FIG. 5 is a schematic electrical circuit diagram of static NAND logic gate circuitry, indicated by dashed enclosure 50, according to a first alternative embodiment. As shown in FIG. 5, circuitry 50 is readily synthesizable by coupling an output of a first two-input NAND logic gate 52 through a CMOS inverter 54 to a first input of a second NAND logic gate 56. Accordingly, circuitry 50 has three input nodes, A, B and C, so that circuitry 50 is a three-input NAND logic gate. In the alternative embodiment of FIG. 5, gate 56 is substantially identical in design and implementation to circuitry 20 of FIG. 2.

Circuitry 50 operates according to the following truth table:

| Output Signal | Input Signals | | |
| --- | --- | --- | --- |
| D/ | A | B | C |
| 1 | 0 | 0 | 0 |
| 1 | 0 | 0 | 1 |
| 1 | 0 | 1 | 0 |

| Output Signal | Input Signals | | |
|---|---|---|---|
| D/ | A | B | C |
| 1 | 0 | 1 | 1 |
| 1 | 1 | 0 | 0 |
| 1 | 1 | 0 | 1 |
| 1 | 1 | 1 | 0 |
| 0 | 1 | 1 | 1 |

According to this truth table, D=A * B * C, where * represents a logical AND function, and where D/ is the logical inverse of D. In FIG. 5, OUT=D/ with respect to the truth table shown above.

Figure 6:
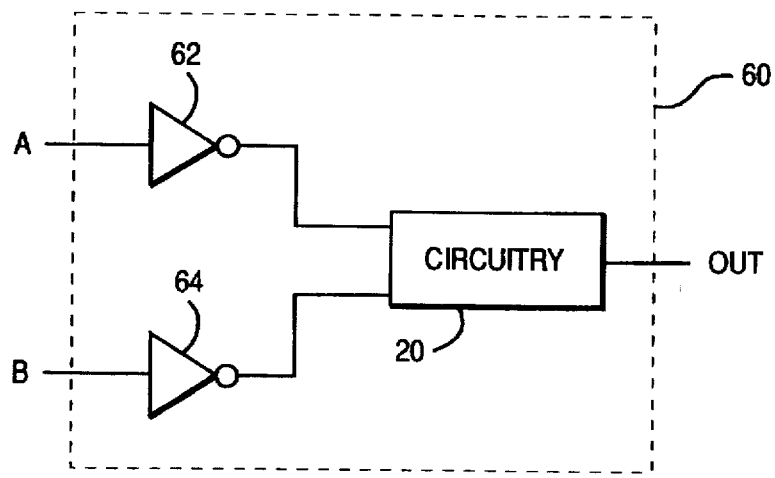
FIG. 6 is a schematic electrical circuit diagram of static OR logic gate circuitry according to a second alternative embodiment.

FIG. 6 is a schematic electrical circuit diagram of static OR logic gate circuitry, indicated by dashed enclosure 60, according to a second alternative embodiment. As shown in FIG. 6, circuitry 60 is readily synthesizable by coupling input node A through a CMOS inverter 62 to a first input (i.e. to the gates of transistors T1 and T2) of circuitry 20 (FIG. 2), and by coupling input node B through a CMOS inverter 64 to a second input (i.e. to the gates of transistors T3, T4 and T5) of circuitry 20. Accordingly, circuitry 60 is a two-input OR logic gate.

Circuitry 60 operates according to the following truth table:

| Output Signal | Input Signals | |
|---|---|---|
| D | A | B |
| 0 | 0 | 0 |
| 1 | 0 | 1 |
| 1 | 1 | 0 |
| 1 | 1 | 1 |

According to this truth table, D=A+B, where + represents a logical OR function. In FIG. 6, OUT=D with respect to the truth table shown above.

Although an illustrative embodiment of the present inventions and their advantages have been described in detail hereinabove, it has been described as example and not as limitation. Various changes, substitutions and alterations can be made in the illustrative embodiment without departing from the breadth, scope and spirit of the present inventions. The breadth, scope and spirit of the present inventions should not be limited by the illustrative embodiment, but should be defined only in accordance with the following claims and equivalents thereof.

What is claimed is:

1. Circuitry, comprising:
   first and second input nodes;
   an output node;
   a voltage supply node having a first logic state;
   a voltage reference node having a second logic state;
   a first inverter including:
      a first input connected to said first input node;
      a first output connected to said output node;
      a first supply node connected to said voltage supply node; and
      a first reference node;
   a second inverter including:
      a second input connected to said second input node;
      a second output connected to said first reference node;
      a second supply node connected to said voltage supply node; and
      a second reference node connected to said voltage reference node; and
   a p channel field effect transistor ("FET") transistor including:
      a gate coupled to said second input node;
      a source coupled to said voltage supply node; and
      a drain coupled to said output node.

2. The circuitry of claim 1 wherein said inverters are complementary metal oxide semiconductor inverters.

3. The circuitry of claim 2 wherein:
   said first inverter includes a first p channel FET and a first n channel FET;
   said second inverter includes a second p channel FET and a second n channel FET;
   said first input is connected to gates of said first p channel FET and said first n channel FET;
   said first output is connected to drains of said first p channel FET and said first n channel FET;
   said first supply node is connected to a source of said first p channel FET;
   said first reference node is connected to a source of said first n channel FET;
   said second input is connected to gates of said second p channel FET and said second n channel FET;
   said second output is connected to drains of said second p channel FET and said second n channel FET;
   said second supply node is connected to a source of said second p channel FET; and
   said second reference node is connected to a source of said second n channel FET.

4. A method, comprising:
   sizing first, second, third and fourth transistors of circuitry so that a logic state of an output node is operable to transition:
      within a first period of time after transitioning of a logic state of a first input node; and
      within a second period of time after transitioning of a logic state of a second input node, said first period of time being significantly less than said second period of time, said circuitry including a supply node and a reference node, said supply node having a first logic state, said reference node having a second logic state, said first input node being connected to gates of said first and second transistors, said output node being connected to drains of said first and second transistors, said second input node being connected gates of said third and fourth transistors, said reference node being connected to a source of said fourth transistor, said supply node being connected to sources of said first and third transistors, and a source of said second transistor being connected to drains of said third and fourth transistors.

5. The method of claim 4 and further comprising sizing a fifth transistor so that said logic state of said output node is operable to transition:
   within said first period of time after transitioning of said logic state of said first input node; and
   within said second period of time after transitioning of said logic state of said second input node, said second input node being connected to a gate of said fifth transistor, said supply node being connected to a source of said fifth transistor, and said output node being connected to a drain of said fifth transistor.

* * * * *